(12) United States Patent
Lambert

(10) Patent No.: US 6,617,844 B2
(45) Date of Patent: Sep. 9, 2003

(54) COMPARE PATH BANDWITH CONTROL FOR HIGH PERFORMANCE AUTOMATIC TEST SYSTEMS

(75) Inventor: Craig J. Lambert, Plano, TX (US)

(73) Assignee: Texas Instruments Incorporated, Dallas, TX (US)

(*) Notice: Subject to any disclaimer, the term of this patent is extended or adjusted under 35 U.S.C. 154(b) by 0 days.

(21) Appl. No.: 10/253,794

(22) Filed: Sep. 23, 2002

(65) Prior Publication Data

US 2003/0020458 A1 Jan. 30, 2003

Related U.S. Application Data

(62) Division of application No. 09/871,748, filed on Jun. 1, 2001.

(51) Int. Cl.[7] .............................................. G01R 31/26
(52) U.S. Cl. .................. 324/158.1; 324/73.1; 324/765
(58) Field of Search ........................ 324/765, 158.1, 324/73.1, 763; 714/726, 735, 736

(56) References Cited

U.S. PATENT DOCUMENTS

| 4,908,576 | A | * | 3/1990 | Jackson | 714/726 |
| 5,210,527 | A | * | 5/1993 | Smith et al. | 340/659 |
| 6,133,725 | A | * | 10/2000 | Bowhers | 324/158.1 |
| 6,479,985 | B2 | * | 11/2002 | Lambert | 324/158.1 |

* cited by examiner

*Primary Examiner*—Kamand Cuneo
*Assistant Examiner*—Tung X. Nguyen
(74) *Attorney, Agent, or Firm*—Peter K. McLarty; W. James Brady, III; Frederick J. Telecky, Jr.

(57) ABSTRACT

The compare path bandwidth control for high performance automatic test systems provides a standard dual comparator mode with single ended transmission lines for low frequency applications with a capability of receiving a differential signal when using the dual comparators (40), (41) as an effective single comparator for high frequency applications.

7 Claims, 2 Drawing Sheets

COMPARE PATH BANDWITH CONTROL FOR HIGH PERFORMANCE AUTOMATIC TEST SYSTEMS

This application is a divisional of application Ser. No. 09/871,748, filed Jun. 1, 2001.

FIELD OF THE INVENTION

The present invention relates to compare path bandwidth control for high performance automatic test systems

BACKGROUND OF THE INVENTION

As integrated circuits become larger and faster the need for high performance automatic test systems becomes greater. Typically, integrated circuits or devices are tested using automatic test systems. For digital integrated circuits, a large portion of the testing consists of supplying input logic signals to some of the terminals of the integrated circuit and reading output logic signals from other terminals. These logic signals will consist of voltage levels representing a logic zero and a logic one. To detect the presence of these logic zeros and ones, the automatic test system should be capable of detecting the level of voltage pulses at varying frequencies. The input and output logic signals are typically applied and measured through a test head assembly which provides electrical contact and signals to the leads or contacts of the integrated circuit. The logic signal from the integrated circuit is fed through cables from the test head assembly to the main body of the test system where the signals are analyzed to determine the functionality of the integrated circuit or device under test (DUT). For low frequency applications (i.e. signal frequencies<100 MHz with a minimum pulse width of about 2.5 ns) a single ended cable and circuit configuration can be used to interconnect the test head assembly with the main body of the test system. A typical single ended cable and circuit configuration used in automated test systems is illustrated in FIG. 1. The test head assembly 10 is interconnected to the main body of the test system 15 through cables 20 and 21. For typical large pin integrated circuits there may be as many as 1024 such cables interconnecting the test head assembly 10 to the main body of the system 15. As shown in FIG. 1, the cables 20 and 21 can be driven by amplifier/comparators 40 and 41 in a single ended configuration. The amplifiers/comparators 40 and 41 will be fed an input signal (I) derived from the integrated circuit through an input terminal 100 and will compare this input signal to reference signals VREFUP and VREFDN to determine if a logic one or a logic zero signal is being output from the integrated circuit. The output of the amplifiers/comparators 40 and 41 is fed through cables 20 and 21 to receivers 42 and 43 on the main body of the system 15. The output of the receivers 42 and 43 will be used to determine if the integrated circuit under test passes or fails the particular functional test. Shown in FIG. 1 is a typical configuration where the pass/fail logic 44 and 45 is a common circuit on a pin.

As the operating speeds of integrated circuits increase it is becoming increasingly necessary to test the functionality of the circuits at higher frequencies and narrower pulse widths. For some applications it is required to test the circuits at frequencies up to 800 MHz with minimum pulse widths of 625 ps. Under these conditions, the single ended configuration shown in FIG. 1 may not work and some type of differential configuration will be required. A typical differential configuration is shown in FIG. 2. In this scheme, amplifier/comparators 46 and 47 will produce an output signal and a complement output signal which is fed differentially through cables 22, 23, 24 and 25 to the main body of the system 15 where receivers 48 and 49 will be used along with pass/fail logic 44 and 45 to analyze the signal. It is important to note that such a differential scheme requires twice as many cables and interconnections as the low frequency single ended scheme substantially increasing the cost and complexity of the test systems. In addition to cabling, at least twice as many high frequency paths will be required on some of the circuit boards in both the test head assembly and the main body of the system also substantially increasing the cost and complexity of the test system. The differential interconnection schemes required for high frequency testing is a major limitation in the development of advanced high frequency automated integrated circuit test systems.

SUMMARY OF INVENTION

The instant invention is compare path bandwidth control for high performance automatic test systems. An embodiment of instant invention comprises: a first device with a plurality of input terminals and at least one output terminal wherein said first device is a comparator; a second device with a plurality of input terminals and at least one output terminal wherein said second device is a comparator; a third device with a plurality of input terminals and at least one output terminal wherein said third device is a buffer amplifier; a fourth device with a plurality of input terminals and at least one output terminal where said fourth device is a high speed buffer/differential receiver; a fifth device with a plurality of input terminals and at least one output terminal wherein said fifth device is a buffer amplifier; a first programmable voltage source connected to a first of said plurality of input terminals of said first device; a second programmable voltage source connected to a first of said plurality of input terminals of said second device; said first programmable voltage source and said second programmable voltage source can be programmed to the same or to different voltages; an input signal terminal connected to a second of said plurality of input terminals of said first device and a second of said plurality of input terminals of said second device; a first connecting element connecting an output of said first device to one of said plurality of inputs of said third device and to one of said plurality of inputs of said fourth device; a second connecting element connecting an output of said second device to one of said plurality of inputs of said fourth device and to one of said plurality of inputs of said fifth device; a sixth device with at least one output terminal where in said sixth device is a two-to-one multiplexer, a first input terminal connected to an output terminal of said third device, and a second input terminal connected to an output terminal of said fourth device; and a seventh device with at least one output terminal wherein said seventh device is a two-to-one multiplexer, a first input terminal connected to an output terminal of said fifth device, and a second input terminal connected to an output terminal of said fourth device.

The technical advantages of the instant invention will be readily apparent to one skilled in the art from the following FIGUREs, description, and claims.

BRIEF DESCRIPTION OF THE DRAWINGS

For a more complete understanding of the present invention and the advantages thereof, reference is now made to the following description taken in conjunction with the accompanying drawings, wherein like reference numerals represent like features, in which.

DETAILED DESCRIPTION OF THE INVENTION

Figure 1:
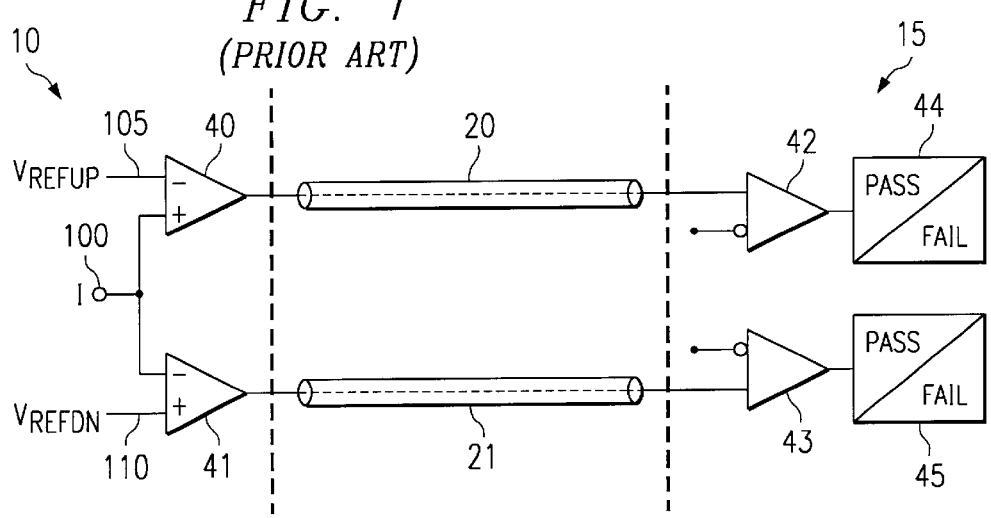
FIG. 1 is a schematic diagram of a typical single ended interconnection scheme used in integrated circuit test systems.
Figure 2:
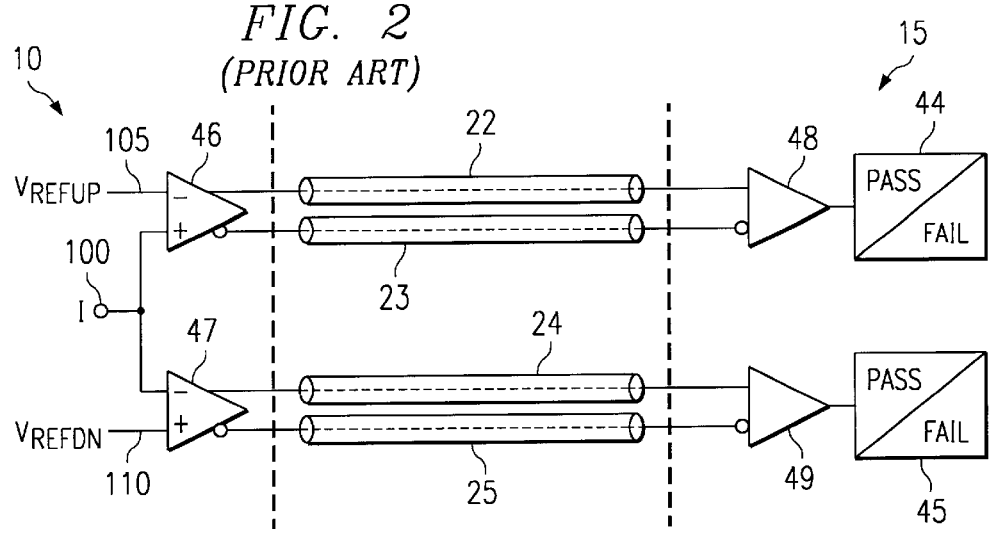
FIG. 2 is a schematic diagram of a typical differential interconnection scheme used in integrated circuit test systems.
Figure 3:
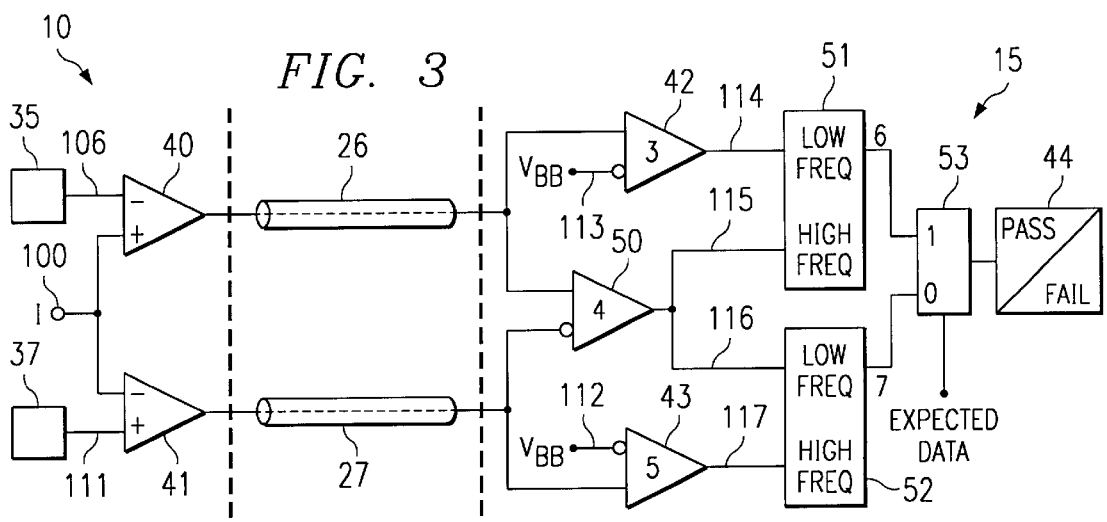
FIG. 3 is a schematic diagram of an embodiment of an interconnection scheme according to the instant invention.
Figure 4:
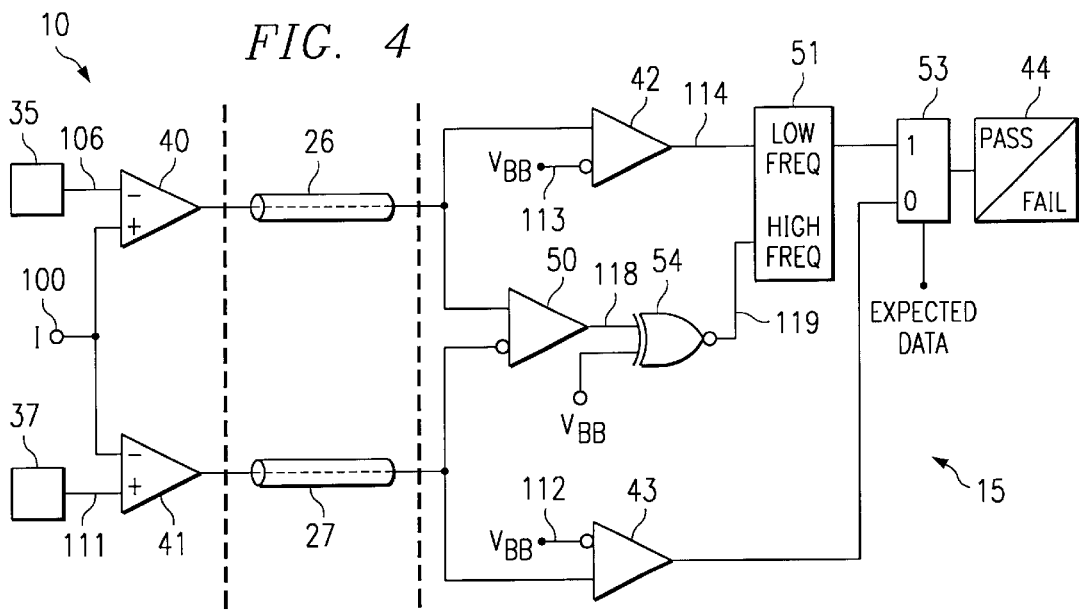
FIG. 4 is a schematic diagram of another embodiment of an interconnection scheme according to the instant invention.
Figure 5:
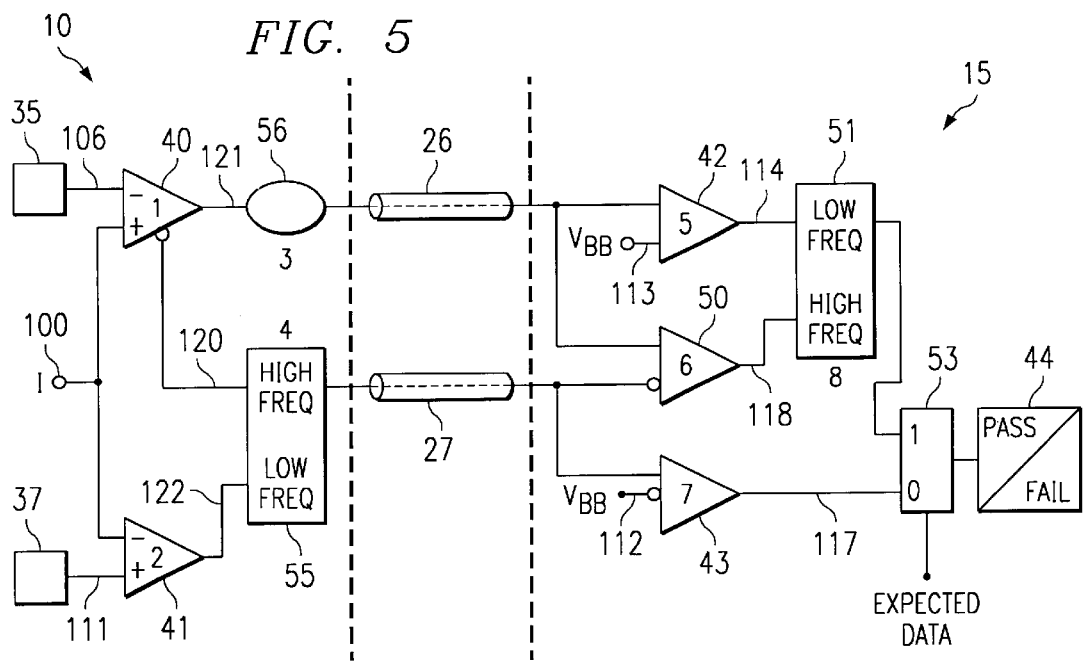
FIG. 5 is a schematic diagram of another embodiment of an interconnection scheme according to the instant invention.

FIGS. 3 through 5 illustrates various aspects of a compare path bandwidth scheme for high performance automatic test systems. As discussed above, the automated test system is made up of a test head assembly which is connected to the main body by cables. The input and output logic signals used for testing are typically applied and measured through the test head assembly which provides electrical contact and signals to the leads or contacts of the integrated circuit. The logic signal from the integrated circuit is fed through cables from the test head assembly to the main body of the test system where the signals are analyzed to determine the functionality of the integrated circuit or device under test (DUT). As described in greater detail below, the method of the instant invention can be used to reduce the cabling and complexity required in high performance test systems while maintaining differential performance.

Illustrated in FIG. 3 is an embodiment of the instant invention. Devices 40 and 41, which form a part of the test head assembly 10 of the test system, are fed with reference signals $V_{REFUP}$ and $V_{REFDN}$ from programmable voltage sources 35 and 37 respectively, and an input signal (I) through 100, the input signal terminal. Here $V_{REFUP}$ is used to define a logic one state and any voltage level above $V_{REFUP}$ is considered a logic one. $V_{REFDN}$ is used to define a logic zero state and any voltage less than $V_{REFDN}$ is considered a logic zero. The input signal (I) is derived from the actual device under test. The input signal (I) is derived from a pin on the test head assembly which is used to electrically contact the integrated circuit under test. In an embodiment of the instant invention, devices 40 and 41 are amplifiers and/or comparators. In this embodiment there are therefore two such comparators for each pin on the test head assembly. In general, devices 40 and 41 function to provide an output signal that depends on whether the input signal (I) is greater or less than signals $V_{REFUP}$ and $V_{REFDN}$. The output signals of devices 40 and 41 are fed through connecting elements 26 and 27 to the main body of the system 15. In one embodiment of the instant invention, connecting elements 26 and 27 and cables in a single ended configuration. In another embodiment, connecting elements 26 and 27 are conductive paths comprising metal wire. The devices 40 and 41 can be used in a single or dual comparator mode. In the dual comparator mode, the voltages $V_{REFUP}$ and $V_{REFDN}$ are programmed independently. In this mode signal frequencies less than 100 MHz (low frequency) with a minimum pulse width of about 2.5 ns can be detected during automated circuit testing. In the single comparator mode, $V_{REFUP}$ and $V_{REFDN}$ would be programmed to the same voltage. This single comparator mode allows devices 40 and 41 to function as an effective differential pair. This effective differential pair allows high speed testing with signal frequencies up to 800 MHz (high frequency) with minimum pulse widths of 625 ps. For the instant invention, test signal frequencies less than 100 MHz will be referred to as low frequency and test signal frequencies greater than 100 MHz will be referred to as high frequency. High speed testing is achieved using just a single pair of cables 26 and 27. There is therefore a single pair of cables for each pin on the test head assembly. For modern integrated circuits with many terminals, the test head assembly could have as many as 512 or more such pins each with the associated circuitry as described above.

In the main body of the test system 15, the signal from the effective differential pair comprising 40 and 41 is received by a differential receiver made up of device 50. In one embodiment, devices 42 and 43 are buffer amplifiers comprised of emitter common logic (ECL) devices, and device 50 is a high speed buffer comprising a differential ECL receiver. Signal $V_{BB}$ is a predetermined voltage and is defined as the threshold for ECL. Any voltage above $V_{BB}$ is a logic one, any voltage below $V_{BB}$ is a logic zero. $V_{BB}$ is usually an internally generated voltage threshold in a single ended receiver. In the single comparator mode, which will be used for high frequency test signals, if the input signal was a rising voltage pulse edge from 0V to 1V with $V_{REFUP}$ and $V_{REFDN}$ both being programmed to 0.5V, the output from device 40 would be a rising pulse edge while the output from device 41 would falling voltage pulse. The output from device 41 would effectively be the complement signal of the output from device 40. Device 50 would receive a true signal from device 40 and the complement signal from device 41. The output signal from device 40 is also fed into device 42 and the output signal from 41 is fed into device 43. $V_{BB}$ is the internally generated threshold for receiving single ended signals. The output signals from 42, 43, and 50 are fed into devices 51 and 52. In an embodiment of the instant invention, devices 51 and 52 comprise two-to-one multiplexers. The multiplexers produce an output signal that is related to either input signal (i.e. the input signals derived from 42 and 50 for device 51 and input signals derived from 43 and 50 for device 52). The multiplexers 50 and 51 are used to select between the single ended signal path 114 and 117 for the dual comparator mode (low frequency test signals) and the high speed or high frequency path 115 and 116 for the single comparator mode. The output signals from 51 and 52 are fed into device 53. In an embodiment of the instant invention, device 53 is a two-to-one multiplexer. Device 53 selects between the output of 51 and 52 depending on whether a logic 0 or a logic 1 is expected (i.e. on the value of the expected data). In addition, 53 could also be used in the high speed mode to determine whether a logic 1 or a logic 0 is expected. The output of 53 will be fed to pass/fail logic to determine if the derived signal passes or fails the particular test parameter. The embodiment of the instant invention shown in FIG. 3 gives the most versatility of dual comparators when the test frequency is low, but also gives the flexibility of a high frequency differential compare path when an effective single comparator is required.

Illustrated in FIG. 4 is another embodiment of the instant invention. Devices 40 and 41, which form a part of the test head assembly 10 of the test system, are fed with reference signals $V_{REFUP}$ and $V_{REFDN}$ from programmable voltage sources 35 and 37 respectively, and an input signal (I) through 100, the input signal terminal. The input signal (I) is derived from the actual device under test. The input signal (I) is derived from a pin on the test head assembly which is used to electrically contact the integrated circuit under test. In an embodiment of the instant invention, devices 40 and 41 are amplifiers and/or comparators. In this embodiment there are therefore two such comparators for each pin on the test head assembly. In general, devices 40 and 41 function to provide an output signal that depends on whether the input signal (I) is greater or less than signals $V_{REFUP}$ and $V_{REFDN}$. The output signals of devices 40 and 41 are fed through connecting elements 26 and 27 to the main body of the system 15. In one embodiment of the instant invention, connecting elements 26 and 27 are cables in a single ended configuration. In another embodiment, connecting elements 26 and 27 are conductive paths comprising metal wire. The devices 40 and 41 can be used in a single or dual comparator mode. In the dual comparator mode, the voltages $V_{REFUP}$ and $V_{REFDN}$ are programmed independently. In this mode signal frequencies less than 100 MHz (low frequency) with a minimum pulse width of about 2.5 ns can be detected during automated circuit testing. In the single comparator mode, $V_{REFUP}$ and $V_{REFDN}$ would be programmed to the same voltage. This single comparator mode allows high speed testing with signal frequencies up to 800 MHz (high frequency) with minimum pulse widths of 625 ps.

In the main body of the test system 15, the signal from this effective differential pair is received by a differential receiver made up of device 50. In one embodiment, devices 42 and 43 are buffer amplifiers comprised of emitter common logic (ECL) devices, and device 50 is a high speed buffer comprising a differential ECL receiver. Signal $V_{BB}$ is a predetermined voltage. In the single comparator mode, which will be used for high frequency test signals, if the input signal was a rising voltage pulse edge from 0V to 1V with $V_{REFUP}$ and $V_{REFDN}$ both being programmed to 0.5V, the output from device 40 would be a rising pulse edge while the output from device 41 would falling voltage pulse. The output from device 41 would effectively be the compliment signal of the output from device 40. Device 50 would receive a true signal from device 40 and the compliment signal from device 41. The output signal from device 40 is also fed into device 42 and the output signal from 41 is fed into device 43. $V_{BB}$ is an internally generated threshold for receiving single ended signals. As Shown in FIG. 4, the output of 50 is fed into 54. In an embodiment of the instant invention, 54 is a high speed logic inverter. The output of 54 is fed through 119 to an input of 51. The output of 42 is fed through 114 to another input of device 51. In one embodiment, device 51 is a two-to-one multiplexer. The output of 51 is fed into an input of 53 and the output of 43 is fed into another input of 53. When the single comparator mode of operation for 40 and 41 is selected for high frequency test signals, 51 will be used to select the high frequency input signal being fed into 51 through 119. In this case 53, which is a two-to-one multiplexer, will select the up comparator/high frequency path. This signal will be fed into 44 to determine if a pass or fail condition exists for the particular test. In the dual comparator mode of operation for 40 and 41, the low frequency input will be chosen in 51 and the output of 53 will be logic 1 or logic 0 depending on the test conditions and the expected data signal.

Another embodiment of the instant invention is shown in FIG. 5. Devices 40 and 41, which form a part of the test head assembly 10 of the test system, are fed with reference signals $V_{REFUP}$ and $V_{REFDN}$ from programmable voltage sources 35 and 37 respectively, and an input signal (I) through 100, the input signal terminal. The input signal (I) is derived from the actual device under test. The input signal (I) is derived from a pin on the test head assembly which is used to electrically contact the integrated circuit under test. In an embodiment of the instant invention, devices 40 and 41 are amplifiers and/or comparators. In this embodiment there are therefore two such comparators for each pin on the test head assembly. In general, devices 40 and 41 function to provide an output signal that depends on whether the input signal (I) is greater or less than signals $V_{REFUP}$ and $V_{REFDN}$. The complement of the output signal of 40 is fed through 120 to an input of 55. The output of 41 is fed through 122 to another input of 55. The output of 40 is fed through 121 to 56. Device 56 will be used to provide a delay to the signal being output from 40. For high frequency test signals, the input signal to 55 provided through 120 would be chosen. For low frequency test signals, the input to 55 provided by 122 would be chosen. This provides a true single comparator mode for high frequency test signals since the true and complement signals are generated from the same comparator. Although it would be ideal for the signal delay provided by 56 to match the signal delay caused by the presence of 55, such a signal delay match is not critical. Slight variations in delays between the signals will only appear as an offset in time provided that the pulse width of the true and compliment signals on 40 (i.e. signals on 121 and 120 respectively) match. The output signals of devices 56 and 55 are fed through connecting elements 26 and 27 to the main body of the system 15. In one embodiment of the instant invention, connecting elements 26 and 27 are cables in a single ended configuration. In another embodiment, connecting elements 26 and 27 are conductive paths comprising metal wire. The devices 40 and 41 can be used in a single or dual comparator mode. In the dual comparator mode, the voltages $V_{REFUP}$ and $V_{REFDN}$ are programmed independently. In this mode signal frequencies less than 100 MHz (low frequency) with a minimum pulse width of about 2.5 ns can be detected during automated circuit testing. In the single comparator mode, $V_{REFUP}$ and $V_{REFDN}$ would be programmed to the same voltage. This single comparator mode allows high speed testing with signal frequencies up to 800 MHz (high frequency) with minimum pulse widths of 625 ps.

In the main body of the test system 15, the signals from 26 and 27 are received by a differential receiver made up of device 50. In one embodiment, devices 42 and 43 are buffer amplifiers comprised of emitter common logic (ECL) devices, and device 50 is a high speed buffer comprising a differential ECL receiver. Signal $V_{BB}$ is a predetermined voltage. As Shown in FIG. 5, the output of 50 is fed into 51 through 118. In an embodiment of the instant invention, 51 is a two-to-one multiplexer. The output of 42 is fed through 114 to another input of device 51. The output of 51 is fed into an input of 53 and the output of 43 is fed into another input of 53. When the single comparator mode of operation for 40 and 41 is selected for high frequency test signals, 51, 53, and 55 will be used to select the high frequency input signal. Here 55 selects the complement signal output of 40 which will be received at the complement input of 50. The output of 55 will be fed into 44 to determine if a pass or fail condition exists for the particular test. In the dual comparator mode of operation for 40 and 41, the low frequency input will be chosen in 51 and 55 and the output of 53 will be logic 1 or logic 0 depending on the test conditions and the expected data signal.

There are two main advantages to the instant invention. The first advantage is that dual comparators are still available for low frequency applications. With separate up and down reference levels that are programmable, the test time will be reduced compared to a single comparator tester scheme. For a single comparator, the reference level would have to be first programmed to expect a low level during test pattern execution, then reprogrammed to expect a high level and then the same pattern would have to be re-executed. This is called two pass testing since the same pattern is executed twice while expecting a high level during one execution and a low level in the other execution. This can significantly increase test time. Two pass testing would not be required on a tester with dual comparators. Also the tester with a single comparator would not have the capability of expecting a tristate level without a two pass test approach.

The second advantage, as mention above, is the number of cables and connectors required. Since a dual comparator approach is the preferred architecture from a test time standpoint, having a differential transmission path per comparator would be difficult to implement. It would require twice as many high quality transmission paths. This would not only add cost to the test systems, but the test head assembly. The programmable mode of the instant invention will maintain the low cost test assembly, but will extend the compare path bandwidth for the high frequency test signal requirements.

While this invention has been described with reference to illustrative embodiments, this description is not intended to be construed in a limiting sense. Various modifications and combinations of the illustrative embodiments, as well as other embodiments of the invention will be apparent to persons skilled in the art upon reference to the description. It is therefore intended that the appended claims encompass any such modifications or embodiments.

I claim:

1. A circuit for high performance automatic test systems, comprising:

a first device with a plurality of input terminals and at least one output terminal;

a second device with a plurality of input terminals and at least one output terminal;

a first programmable voltage source connected to a first of said plurality of input terminals of said first device;

a second programmable voltage source connected to a first of said plurality of input terminals of said second device;

an input signal terminal connected to a second of said plurality of input terminals of said first device and a second of said plurality of input terminals of said second device;

a third device with an input terminal connected to a first output terminal of said first device and at least one output terminal;

a fourth device with a first input terminal connected to a second output terminal of said first device, a second input terminal connected to a first output terminal of said second device, and at least one output terminal;

a fifth device with a first input terminal connected to a first output of said third device and at least one output terminal;

a sixth device with a first input terminal connected to said first output of said third device, a second input terminal connected to a first output terminal of said fourth device, and at least one output terminal;

a seventh device with a first input terminal connected to said first output terminal of said fourth device and at least one output terminal; and an eighth device with a first input terminal connected to a first output terminal of said fifth, a second input terminal connected to a first output terminal of said sixth device, and at least one output terminal.

2. The circuit of claim 1 wherein said first and second devices are comparators.

3. The circuit of claim 1 wherein said third device functions to provide a signal delay.

4. The circuit of claim 1 wherein said fourth device is a two-to-one multiplexer.

5. The circuit of claim 1 wherein said fifth and seventh devices are buffer amplifiers.

6. The circuit of claim 1 wherein said sixth device is a high speed buffer/differential receiver.

7. The circuit of claim 1 wherein said eighth device is a two-to-one multiplexer.

* * * * *